United States Patent
Udaka et al.

(10) Patent No.: US 9,520,449 B2
(45) Date of Patent: Dec. 13, 2016

(54) PHOTOELECTRIC CONVERSION DEVICE, SOLID-STATE IMAGE PICKUP UNIT, AND ELECTRONIC APPARATUSES HAVING WORK FUNCTION ADJUSTMENT LAYERS AND DIFFUSION SUPPRESSION LAYERS

(71) Applicant: SONY CORPORATION, Tokyo (JP)

(72) Inventors: Toru Udaka, Kanagawa (JP); Osamu Enoki, Kanagawa (JP); Masaki Murata, Tokyo (JP); Rui Morimoto, Kanagawa (JP); Ryoji Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/437,270

(22) PCT Filed: Sep. 25, 2013

(86) PCT No.: PCT/JP2013/075812
§ 371 (c)(1),
(2) Date: Apr. 21, 2015

(87) PCT Pub. No.: WO2014/073278
PCT Pub. Date: May 15, 2014

(65) Prior Publication Data
US 2015/0287765 A1    Oct. 8, 2015

(30) Foreign Application Priority Data
Nov. 6, 2012    (JP) .................................. 2012-244506

(51) Int. Cl.
*H01L 27/30* (2006.01)
*H01L 51/44* (2006.01)
(Continued)

(52) U.S. Cl.
CPC ......... *H01L 27/307* (2013.01); *H01L 51/4273* (2013.01); *H01L 51/441* (2013.01);
(Continued)

(58) Field of Classification Search
CPC ..... H01L 27/307; H01L 51/441; H01L 51/442
See application file for complete search history.

(56) References Cited

U.S. PATENT DOCUMENTS

2007/0063156 A1 * 3/2007 Hayashi ................ H01L 51/424
250/559.07
2007/0138637 A1    6/2007 Prakash
(Continued)

FOREIGN PATENT DOCUMENTS

JP    S61-184812    8/1986
JP    2004-335610    11/2004
(Continued)

OTHER PUBLICATIONS

International Search Report prepared by the Japanese Patent Office on Dec. 27, 2013, for International Application No. PCT/JP2013/075812.
(Continued)

*Primary Examiner* — Michael Jung
(74) *Attorney, Agent, or Firm* — Sheridan Ross P.C.

(57) ABSTRACT

A photoelectric conversion device includes an organic photoelectric conversion film; a first electrode and a second electrode provided with the organic photoelectric conversion film in between; and a charge block layer provided between the second electrode and the organic photoelectric conversion film, in which the charge block layer includes a work function adjustment layer including a metal element on the second electrode side of the organic photoelectric conversion film, the metal element being adopted to adjust a work function, and a first diffusion suppression layer provided
(Continued)

between the work function adjustment layer and the second electrode and suppressing diffusion of the metal element to the second electrode side.

12 Claims, 13 Drawing Sheets

(51) Int. Cl.
*H01L 51/42* (2006.01)
*H01L 51/00* (2006.01)

(52) U.S. Cl.
CPC ........ *H01L 51/442* (2013.01); *H01L 51/0072* (2013.01); *H01L 2251/301* (2013.01); *H01L 2251/305* (2013.01); *H01L 2251/306* (2013.01); *H01L 2251/308* (2013.01)

(56) References Cited

U.S. PATENT DOCUMENTS

2008/0230123 A1* 9/2008 Mitsui ................ C09B 23/0066
136/263

2010/0089452 A1* 4/2010 Suzuki ................... B82Y 10/00
136/263
2014/0239278 A1* 8/2014 Park ..................... H01L 51/442
257/40

FOREIGN PATENT DOCUMENTS

| | | |
|---|---|---|
| JP | 2010-161269 A | 7/2010 |
| JP | 2011-187918 A | 9/2011 |
| JP | 2012-19235 A | 1/2012 |
| WO | WO 01/67824 | 9/2001 |
| WO | WO 2010/138414 | 12/2010 |
| WO | WO 2013/035305 | 3/2013 |

OTHER PUBLICATIONS

Partial European Search Report for European Patent Application No. 13853503.4 dated Jun. 28, 2016, 7 pp.
Extended European Search Report for European Patent Application No. 13853503.4 dated Sep. 30, 2016, 10 pages.
Official Action (no English translation available) for Chinese Patent Application No. 201310528746.5 dated Sep. 2, 2016, 7 pages.

* cited by examiner

S1

S2

PHOTOELECTRIC CONVERSION DEVICE, SOLID-STATE IMAGE PICKUP UNIT, AND ELECTRONIC APPARATUSES HAVING WORK FUNCTION ADJUSTMENT LAYERS AND DIFFUSION SUPPRESSION LAYERS

CROSS REFERENCE TO RELATED APPLICATIONS

This application is a national stage application under 35 U.S.C. 371 and claims the benefit of PCT Application No. PCT/JP2013/075812 having an international filing date of Sep. 25, 2013, which designated the United States, which PCT application claimed the benefit of Japanese Patent Application No. 2012-244506 filed Nov. 6, 2012, the disclosures of which are incorporated herein by reference in their entirety.

TECHNICAL FIELD

The present disclosure relates to a photoelectric conversion device using an organic photoelectric conversion material, and a solid-state image pickup unit and an electronic apparatus that include such a photoelectric conversion device as a pixel.

BACKGROUND ART

As a solid-state image pickup unit such as a CCD (Charge Coupled Device) image sensor or a CMOS (Complementary Metal Oxide Semiconductor) image sensor, a solid-state image pickup unit using an organic photoelectric conversion film made of an organic semiconductor for each pixel has been proposed (for example, PTL 1).

In this solid-state image pickup unit, each pixel has a configuration in which the above-described organic photoelectric conversion film is sandwiched between a pair of electrodes for signal extraction. In such a configuration, a technique of providing a charge block layer (charge blocking layer) using an organic material to adjust a work function difference between the electrode and the organic photoelectric conversion film has been proposed (refer to PTL 2).

CITATION LIST

Patent Literature

PTL 1: Japanese Unexamined Patent Application Publication No. 2011-187918
PTL 2: Japanese Unexamined Patent Application Publication No. 2012-19235

SUMMARY OF INVENTION

However, it is desirable to achieve a photoelectric conversion device capable of stabilizing device characteristics and improving reliability by a technique different from that in the above-described PTL 2.

Therefore, it is desirable to provide a photoelectric conversion device, a solid-state image pickup unit, and an electronic apparatus that are capable of stabilizing device characteristics and improving reliability.

A photoelectric conversion device according to an embodiment of the present disclosure includes: an organic photoelectric conversion film; a first electrode and a second electrode provided with the organic photoelectric conversion film in between; and a charge block layer provided between the second electrode and the organic photoelectric conversion film, in which the charge block layer includes a work function adjustment layer including a metal element on the second electrode side of the organic photoelectric conversion film, the metal element being adopted to adjust a work function, and a first diffusion suppression layer provided between the work function adjustment layer and the second electrode and suppressing diffusion of the metal element to the second electrode side.

A solid-state image pickup unit according to an embodiment of the present disclosure is provided with a plurality of pixels each of which includes the above-described photoelectric conversion device according to the embodiment of the present disclosure.

An electronic apparatus according to an embodiment of the present disclosure is provided with the above-described solid-state image pickup unit according to the embodiment of the present disclosure.

In the photoelectric conversion device, the solid-state image pickup unit, and the electronic apparatus according to the embodiments of the present disclosure, the charge block layer is included between the second electrode, out of the first electrode and the second electrode provided with the organic photoelectric conversion film in between, and the organic photoelectric conversion film. Since this charge block layer includes the work function adjustment layer including the metal element for adjustment of the work function on the second electrode side of the organic photoelectric conversion film, charge movement from the second electrode to the organic photoelectric conversion film is suppressed to allow for efficient signal extraction. Since the first diffusion suppression layer is included between such a work function adjustment layer and the second electrode, diffusion of the metal element to the second electrode side is suppressed, and a function of the above-described work function adjustment layer is stably maintained.

In the photoelectric conversion device, the solid-state image pickup unit, and the electronic apparatus according to the embodiments of the present disclosure, the charge block layer is included between the second electrode, out of the first electrode and the second electrode provided with the organic photoelectric conversion film in between, and the organic photoelectric conversion film, and the charge block layer includes the work function adjustment layer including a predetermined metal element; therefore, efficient signal extraction is allowed. On the other hand, the first diffusion suppression layer is included between this work function adjustment layer and the second electrode; therefore, diffusion of the metal element to the second electrode side is allowed to be suppressed, and the function of the above-described work function adjustment layer is allowed to be stably maintained. Accordingly, device characteristics are allowed to be stabilized, and reliability is allowed to be improved.

DESCRIPTION OF EMBODIMENTS

Some embodiments of the present disclosure will be described in detail below referring to the accompanying drawings. It is to be noted that description will be given in the following order.

1. Embodiment (An example of a photoelectric conversion device including a charge block layer (a work function adjustment layer and a diffusion suppression layer) between an organic photoelectric conversion film and a second electrode)
2. Modification Example 1 (Another example of the charge block layer)
3. Modification Example 2 (Another example of the charge block layer)
4. Entire Configuration Example of Solid-state Image Pickup Unit
5. Application Example (An example of an electronic apparatus (camera))

Embodiment

Configuration

Figure 1:
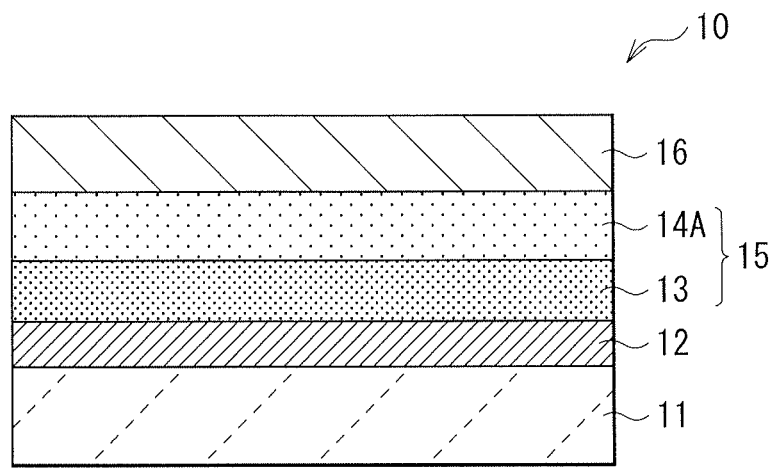
FIG. 1 is a schematic view illustrating a schematic configuration of a photoelectric conversion device (pixel) according to an embodiment of the present disclosure.

FIG. 1 illustrates a configuration of a photoelectric conversion device (a photoelectric conversion device 10) according to an embodiment of the present disclosure. The photoelectric conversion device 10 is used as a pixel of a solid-state image pickup unit according to an embodiment of the present disclosure. As will be described in detail later, the solid-state image pickup unit may be, for example, a CCD (Charge Coupled Device) or CMOS (Complementary Metal Oxide Semiconductor) image sensor or the like. The photoelectric conversion device 10 may be provided on, for example, a substrate (not illustrated) including a pixel transistor and a wiring line, and may be coated with a sealing film, a planarization film, and the like that are not illustrated. Moreover, for example, an on-chip lens that is not illustrated may be provided on the planarization film.

The photoelectric conversion device 10 is an organic photoelectric conversion device that absorbs light of a selective wavelength (for example, color light of any one of R, G, and B) with use of an organic semiconductor to generate an electron-hole pair. In the solid-state image pickup unit that will be described later, the photoelectric conversion devices 10 (pixels) of these respective colors R, G, and B are two-dimensionally arranged side by side. Alternatively, the photoelectric conversion device 10 may have a configuration in which a photoelectric conversion layer made of an organic semiconductor and a photoelectric conversion layer made of an inorganic semiconductor are laminated along a vertical direction in one pixel. In this embodiment, a main-part configuration of such a photoelectric conversion device will be described referring to FIG. 1.

This photoelectric conversion device 10 includes an organic photoelectric conversion film 12 between a first electrode 11 and a second electrode 16. The first electrode 11 and the second electrode 16 are configured to extract a signal charge (a hole or an electron) generated in the organic photoelectric conversion film 12.

The first electrode 11 may be configured of, for example, a transparent conductive film with light transparency such as ITO (indium tin oxide) or the like. As the transparent conductive film, in addition to ITO, tin oxide (TO), a tin oxide ($SnO_2$)-based material doped with a dopant, or a zinc oxide-based material in which zinc oxide (ZnO) is doped with a dopant may be used. Examples of the zinc oxide-based material may include aluminum zinc oxide (AZO) doped with aluminum (Al) as a dopant, gallium zinc oxide (GZO) doped with gallium (Ga), and indium zinc oxide (IZO) doped with indium (In). Moreover, in addition to them, CuI, $InSbO_4$, ZnMgO, $CuInO_2$, $MgIN_2O_4$, CdO, $ZnSnO_3$, or the like may be used. In the following action description and examples, a case where this first electrode 11 is made of ITO (with a work function: about 4.7 eV) is assumed; however, as the first electrode 11, in addition to ITO, the above-described various transparent conductive films are used.

The second electrode 16 may be made of, for example, a simple substance or an alloy of a metal element such as aluminum (Al), copper (Cu), nickel (Ni), chromium (Cr), vanadium (V), titanium (Ti), zirconium (Zr), niobium (Nb), molybdenum (Mo), ruthenium (Ru), palladium (Pd), hafnium (Hf), tantalum (Ta), tungsten (W), platinum (Pt), and gold (Au). Alternatively, this second electrode 16 may also have light transparency. In this case, as a constituent material of the second electrode 16, constituent materials equivalent to the transparent conductive films adopted as the constituent materials of the above-described first electrode 11 are adopted, and one transparent conductive film with a different work function from that of the above-described first electrode 11 of these transparent conductive films is used. In the following action description and examples, a case where this second electrode 16 is made of aluminum (with a work function: about 4.3 eV) is assumed; however, as the second electrode 16, in addition to aluminum, the above-described various electrode materials are used. However, desirably, the second electrode 16 may have a shallower work function than the first electrode 11 in a case where the second electrode 16 functions as an anode, and may have a deeper work function than the first electrode 11 in a case where the second electrode 16 function as a cathode.

It is to be noted that, in the photoelectric conversion device 10, for example, light may be incident from the first electrode 11 side, and light of a predetermined wavelength of this incident light is absorbed in the organic photoelectric conversion film 12. Moreover, in a case where a signal charge is extracted from the first electrode 11, in the solid-state image pickup unit that uses the photoelectric conversion device 10 as a pixel and will be described later, while the first electrodes 11 are provided separately for respective pixels, the second electrode 16 is provided as a common electrode for the respective pixels. Alternatively, in a case where the signal charge is extracted from the second electrode 16, the second electrodes 16 are provided separately for respective pixels, and the first electrode 11 is provided as a common electrode for the respective pixels.

The organic photoelectric conversion film 12 is made of an organic semiconductor that absorbs light in a selective wavelength range to generate an electrical signal. As such an organic semiconductor, various organic pigments are adopted, and examples of the organic semiconductor may include a quinacridone derivative (quinacridones including quinacridone, dimethylquinacridone, diethylquinacridone, dibutylquinacridone, and dihalogen quinacridone such as dichloroquinacridone) and a phthalocyanine derivative (phthalocyanine, SubPC, CuPC, ZnPC, H2PC, and PbPC). Moreover, in addition to them, an oxadiazole derivative (NDO and PBD), a stilbene derivative (TPB), a perylene derivative (PTCDA, PTCDI, PTCBI, and Bipyrene), a tetracyanoquinodimethane derivative (TCNQ and F4-TCNQ), and a phenanthroline derivative (Bphen, Anthracene, Rubrene, and Bianthrone) are adopted. However, in addition to them, for example, a naphthalene derivative, a pyrene derivative, and a fluoranthene derivative may be used. Alternatively, a polymer such as phenylenevinylene, fluorene, carbazole, indole, pyrene, pyrrole, picoline, thiophene, acetylene, or diacetylene, or a derivative thereof may be used. In addition, a metal complex dye, a rhodamine-based dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a chain compound prepared by fusing a fused polycyclic aromatic group such as anthracene or pyrene and an aromatic ring or a heterocyclic compound, quinoline having a squarylium group and a croconic methine group as a joining chain, two nitrogen-containing heterocyclic rings such as benzothiazole and benzoxazole, a cyanine-like dye bonded by a squarylium group and a croconic methine group, or the like may be preferably used. It is to be noted that, as the above-described metal complex dye, an aluminum complex (Alq3 and Balq), a dithiol metal complex-based dye, a metal phthalocyanine dye, a metal porphyrin dye, or a ruthenium complex dye may be preferable; however, the metal complex dye is not limited thereto. Moreover, in the organic photoelectric conversion film 12, in addition to the above-described pigments, other organic materials such as fullerene (C60) and BCP (Bathocuproine) may be laminated. In the following action description and examples, a case where this organic photoelectric conversion film 12 is made of quinacridone is assumed; however, as the organic photoelectric conversion film 12, in addition to quinacridone, the above-described various organic semiconductors may be used. It is to be noted that an energy level of the highest occupied molecular orbital (HOMO) of quinacridone is about 5.3 eV, and an energy level of the lowest unoccupied molecular orbital (LUMO) of quinocridone is about 3.2 eV.

A charge block layer 15 is provided between this organic photoelectric conversion film 12 and the second electrode 16. The charge block layer 15 may include, for example, a work function adjustment layer 13 and a diffusion suppression layer 14A (a first diffusion suppression layer) in order from the organic photoelectric conversion film 12 side. This charge block layer 15 has a function of suppressing (blocking) movement of a charge (for example, a hole) from the second electrode 16 to the organic photoelectric conversion film 12 at least by a function of the work function adjustment layer 13.

The work function adjustment layer 13 has a function of adjusting a work function on the second electrode 16 side of the organic photoelectric conversion film 12. More specifically, the work function adjustment layer 13 is made of a simple substance of a metal element (an inorganic element) having a shallower work function (a lower work function) than the second electrode 16 or an alloy or a compound including such a metal element so as to suppress movement (injection) of a charge (for example, a hole) from the second electrode 16 to the organic photoelectric conversion film 12. Examples of such a metal element may include lithium (Li), beryllium (Be), sodium (Na), magnesium (Mg), potassium (K), calcium (Ca), rubidium (Rb), strontium (Sr), cesium (Cs), and barium (Ba). In the following action description and examples, a case where this work function adjustment layer 13 is made of an alloy of aluminum and lithium (referred to as "AlLi") using lithium as the metal element is assumed; however, in addition to lithium, the above-described various metal elements are used. It is to be noted that a work function of AlLi is about 2.8 eV.

The diffusion suppression layer 14A is provided between the work function adjustment layer 13 and the second electrode 16, and is configured to suppress diffusion of the metal element (for example, lithium) included in the work function adjustment layer 13 to the second electrode 16 side. This diffusion suppression layer 14A may be made of an organic molecule having no oxygen element (O) (hereinafter referred to as "oxygen-free organic molecule"). Examples of the oxygen-free organic molecule may include a phenanthroline derivative, a rubrene derivative, an anthracene derivative, a triazine derivative, a perylene derivative, and a tetracyanoquinodimethane (TCNQ) derivative. The diffusion suppression layer 14A includes one or more kinds of such oxygen-free organic molecules. In the following action description and examples, in this diffusion suppression layer 14A, bathocuproin (BCP) is assumed as the oxygen-free organic molecule according to one embodiment of the present disclosure; however, as the diffusion suppression layer 14A, in addition to this BCP, the above-described various organic molecules are used. It is to be noted that a HOMO level and a LUMO level of BCP are about 6.2 eV and about 2.4 eV, respectively.

[Actions and Effects]

In the photoelectric conversion device 10 of this embodiment, for example, as the pixel of the solid-state image pickup unit, a signal charge may be obtained as follows. That is, when light is incident from, for example, a bottom of the first electrode 11 to the photoelectric conversion device 10, photoelectric conversion is performed on at least a part of this incident light in the organic photoelectric conversion film 12. More specifically, an electron-hole pair is generated by selectively detecting (absorbing) predetermined color light (red light, green light, or blue light) in the organic photoelectric conversion film 12. For example, an electron of the electron-hole pair thereby generated is extracted from the first electrode 11 side, and a hole of the electron-hole pair is extracted from the second electrode 16 side. Image pickup data is obtained by reading one of the electron and the hole as a signal charge to a vertical signal line Lsig that will be described later.

Comparative Example 1

Figure 2:
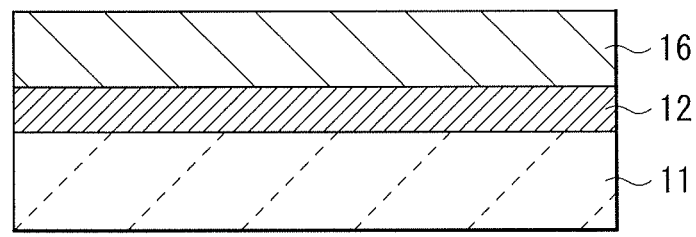
FIG. 2 is a schematic view illustrating a configuration of a photoelectric conversion device (pixel) according to Comparative Example 1.
Figure 3:
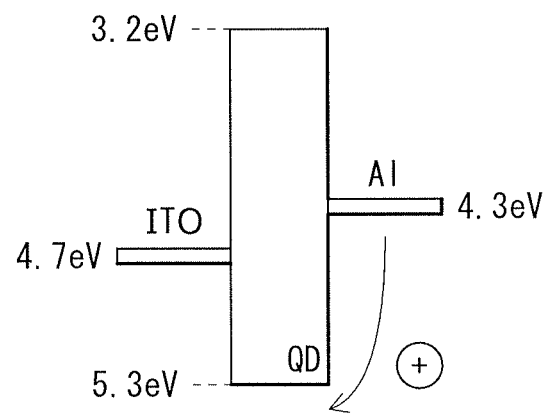
FIG. 3 is a schematic view illustrating an energy band structure of the photoelectric conversion device illustrated in FIG. 2.

FIG. 2 illustrates a configuration of a photoelectric conversion device according to a comparative example (Comparative Example 1) of this embodiment. This photoelectric conversion device includes the organic photoelectric conversion film 12 made of quinacridone (QD) and the second electrode 16 made of aluminum on the first electrode 11 made of ITO. FIG. 3 illustrates an energy band structure of the photoelectric conversion device according to Comparative Example 1. In a laminate configuration of this Comparative Example 1, as illustrated in FIG. 3, an energy difference between the HOMO level (5.3 eV) of quinacridone and the work function (4.3 eV) of aluminum is small; therefore, a so-called dark current is generated by hole movement, and efficient signal extraction is difficult.

Comparative Example 2

Figure 4:
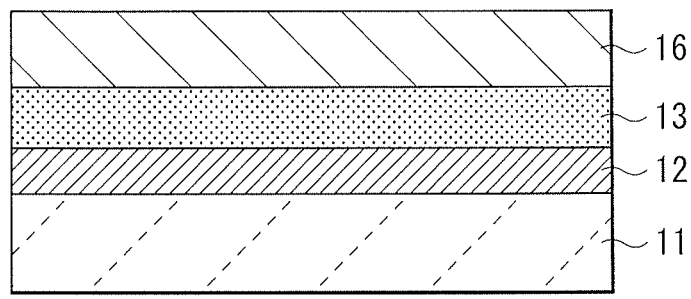
FIG. 4 is a schematic view illustrating a configuration of a photoelectric conversion device (pixel) according to Comparative Example 2.
Figure 5:
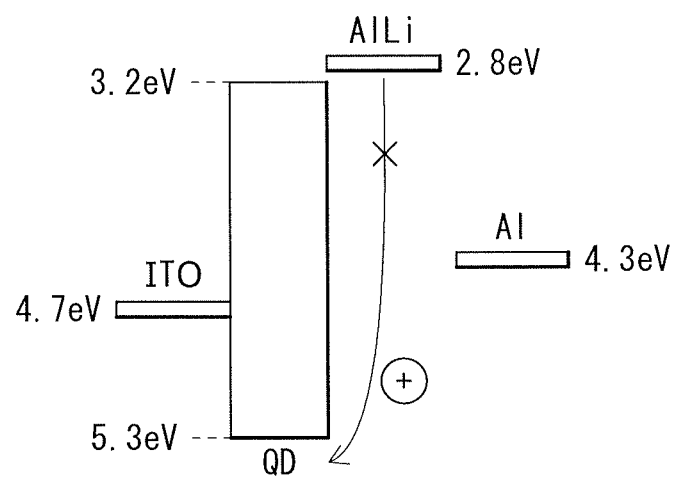
FIG. 5 is a schematic view illustrating an energy band structure of the photoelectric conversion device illustrated in FIG. 4.

FIG. 4 illustrates a configuration of a photoelectric conversion device according to a comparative example (Comparative Example 2) of this embodiment. In this photoelectric conversion device, as with the above-described Comparative Example 1, the organic photoelectric conversion film 12 made of quinacridone (QD) is provided between the first electrode 11 made of ITO and the second electrode 16 made of aluminum. However, in Comparative Example 2, the wok function adjustment layer 13 made of AlLi is included between the organic photoelectric conversion film 12 and the second electrode 16. FIG. 5 illustrates an energy band structure of the photoelectric conversion device according to Comparative Example 2. Thus, in a laminate configuration of Comparative Example 2, AlLi (with a work function: 2.8 eV) with a lower work function than the second electrode 16 is provided as the work function adjustment layer 13 between the organic photoelectric conversion film 12 and the second electrode 16 to serve as a barrier in the energy band structure; therefore, suppression of hole movement to the organic photoelectric conversion film 12 is expected.

Figure 6:
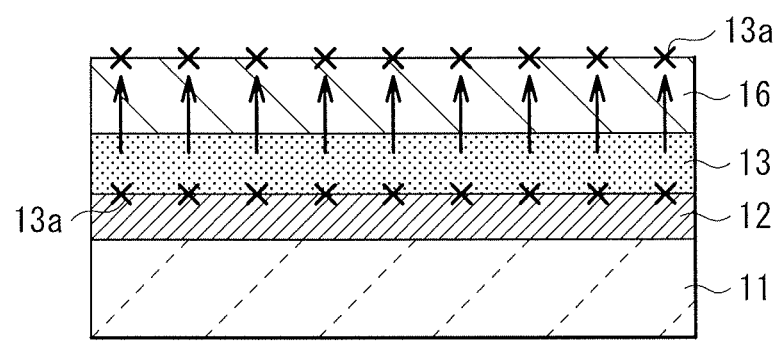
FIG. 6 is a schematic view for describing an action of the photoelectric conversion device illustrated in FIG. 4.
Figure 7:
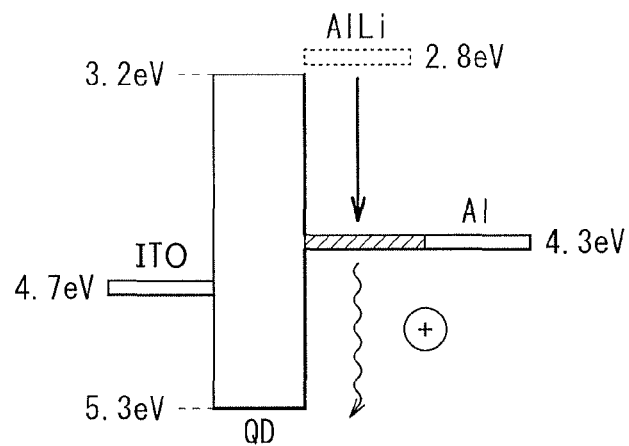
FIG. 7 is a schematic view for describing the action of the photoelectric conversion device illustrated in FIG. 4.

However, as schematically illustrated in FIG. 6, a metal element (lithium) 13a included in the work function adjustment layer 13 is actually diffused to the second electrode 16 side with time, thereby causing a phenomenon in which the metal element 13a rises to a surface of the second electrode 16. It is to be noted that a part of the metal element 13a is also diffused to the organic photoelectric conversion film 12 side. Therefore, as illustrated in FIG. 7, in an actual energy band structure, the work function on the second electrode 16 side of the organic photoelectric conversion film 12 comes close to (or substantially equal to) the work function of the simple substance of aluminum, and a dark current is easily generated by hole movement accordingly. Therefore, it is difficult to achieve desired signal extraction efficiency by forming an ideal energy band structure as illustrated in the above-described FIG. 5.

Figure 8:
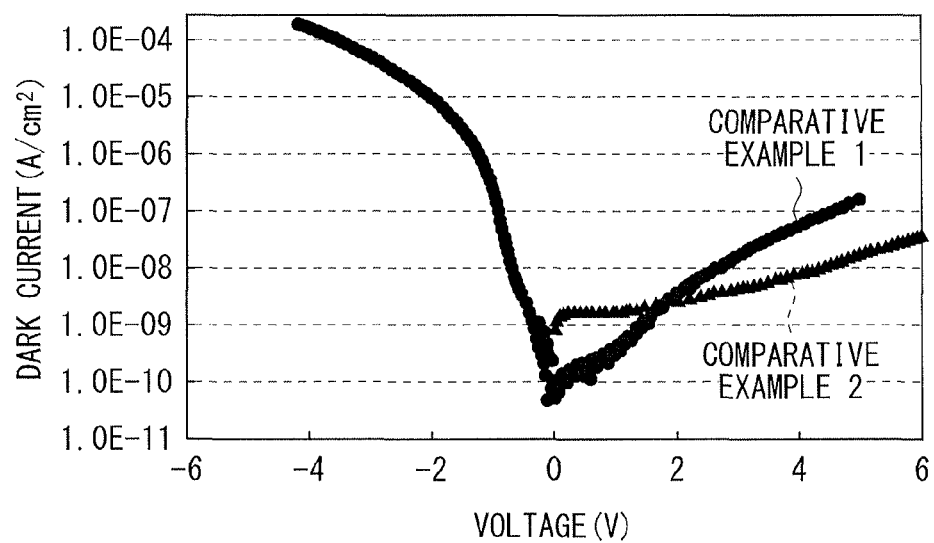
FIG. 8 is a characteristic diagram for describing a dark current generated in each of the devices of Comparative Examples 1 and 2.
Figure 9:
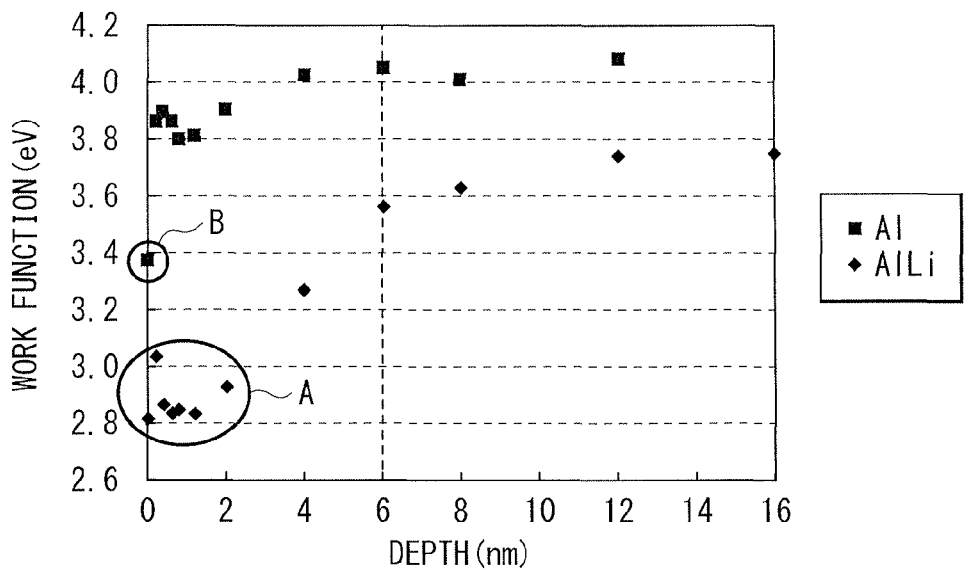
FIG. 9 is a characteristic diagram illustrating a relationship between film formation time and a work function of an electrode in each of the devices of Comparative Examples 1 and 2.

Here, FIG. 8 illustrates measurement results of the dark current in the device configurations of Comparative Examples 1 and 2. It is found that, at the time of non-exposure, compared to Comparative Example 1 in which only the second electrode 16 (Al) is provided on the organic photoelectric conversion film 12, the dark current is more suppressed in Comparative Example 2 in which the work function adjustment layer 13 (AlLi) is further provided. Moreover, FIG. 9 illustrates a relationship between a depth (a thickness) and a work function of each film in a case where each of an Al film and an AlLi film is formed to 20 nm. It is to be noted that a depth of 0 corresponds to an outermost surface of each film, and an element concentration at a surface was measured by a sputtering method in which trimming was performed at constant speed from the outermost surface in a depth direction. As can be seen from this result, while, in the Al film not including lithium, the work function did not vary largely in the depth direction, in the AlLi film, the work function was low at the outermost surface, and the work function increased with an increase in the depth. When the lithium concentration in the AlLi film was measured, the lithium concentration was high in a region from the outermost surface to about 2 to 3 nm (A in FIG. 9); however, while the lithium concentration at the outermost surface was 30 wt %, at a depth of 2 nm from the outermost surface, the lithium concentration was 3 wt %, and was reduced to about $\frac{1}{10}$ of that at the outermost surface. A reduction in the lithium concentration with an increase in the depth was observed in such a manner, and one cause of this is that lithium elements in the AlLi film were drawn to oxygen ($O_2$) in the atmosphere to be diffused. As can be seen from these results, the lithium element in the AlLi film was drawn to oxygen to be diffused, and a change in the lithium concentration due to this diffusion influenced variation in the work function. It is to be noted that B in the diagram is considered to be an influence of carbon in aluminum.

Figure 10A:
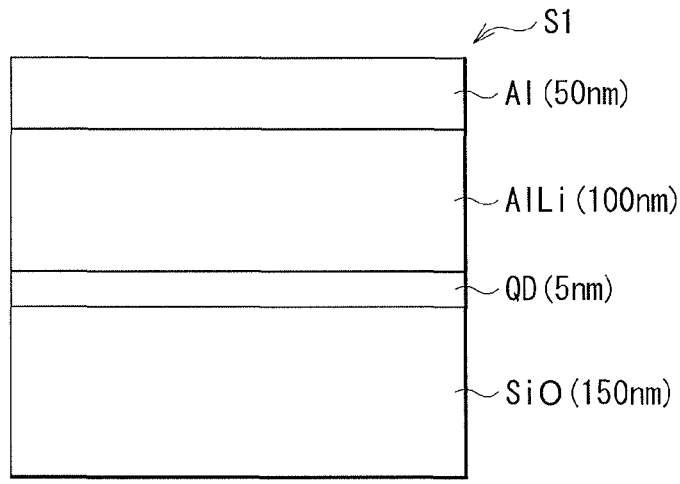
FIG. 10A is a schematic view illustrating a configuration of a test sample using quinacridone.
Figure 10B:
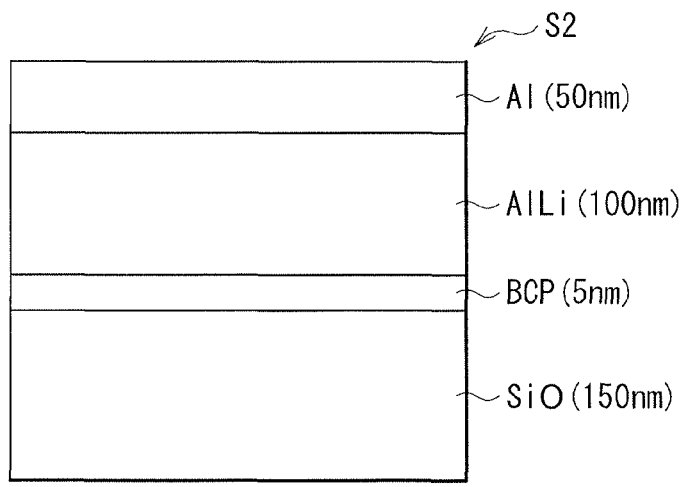
FIG. 10B is a schematic view illustrating a configuration of a test sample using bathocuproin.

Therefore, analysis of the above-described lithium segregation was performed with use of the following test samples (test samples s1 and s2). As illustrated in FIG. 10A, the test sample s1 was formed by forming a QD film (5 nm), an AlLi film (100 nm), and an Al film (50 nm) in this order on a silicon oxide substrate (SiO: 150 nm). As illustrated in FIG. 10B, the test sample s2 was formed by forming a BCP film (5 nm) instead of the QD film in the test sample s1. In this case, QD of the test sample s1 was an organic molecule containing an oxygen element (hereinafter referred to as "oxygen-containing organic molecule"), and is represented by, for example, the following expression (1). On the other hand, BCP of the test sample s2 was an oxygen-free organic molecule, and is represented by, for example, the following expression (2).

[Chem. 1]

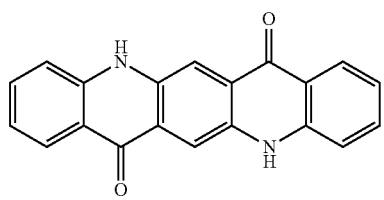

(1)

[Chem. 2]

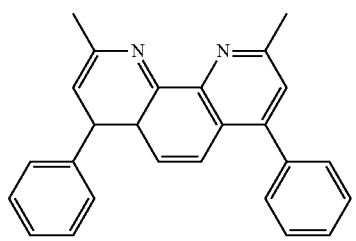

(2)

Figure 11A:
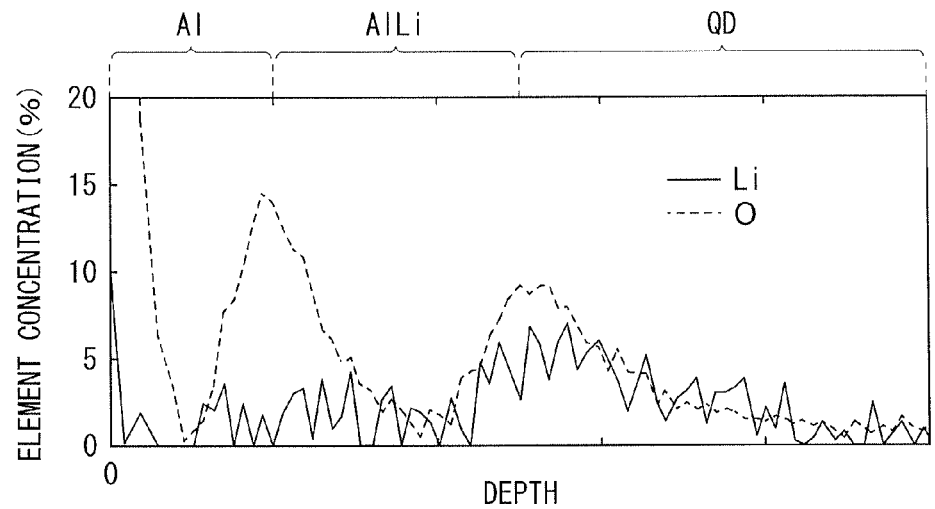
FIG. 11A illustrates film formation time (depth) and an abundance ratio of an element in the test sample illustrated in FIG. 10A.
Figure 11B:
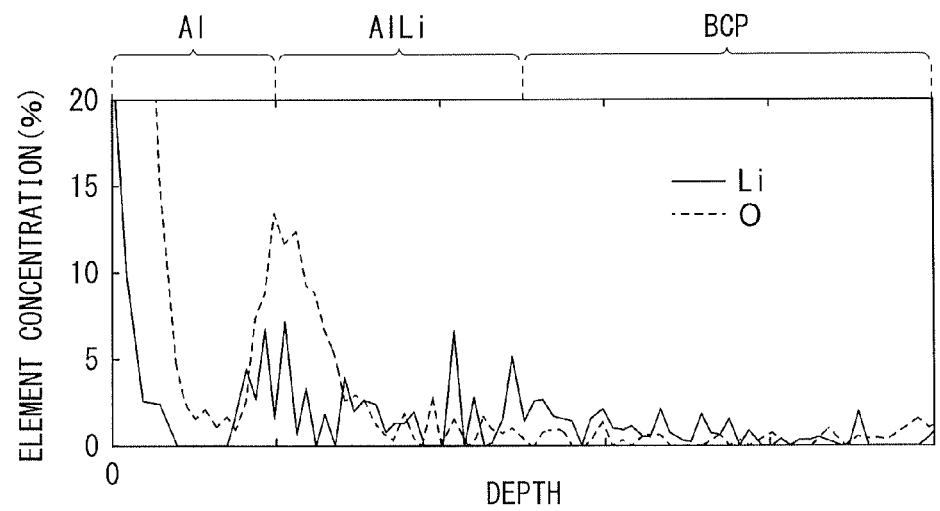
FIG. 11B illustrates film formation time (depth) and an abundance ratio of an element in the test sample illustrated in FIG. 10B.
Figure 12A:
FIG. 12A is a photograph of an aluminum surface after being left in the atmosphere of the test sample illustrated in FIG. 10A.
Figure 12B:
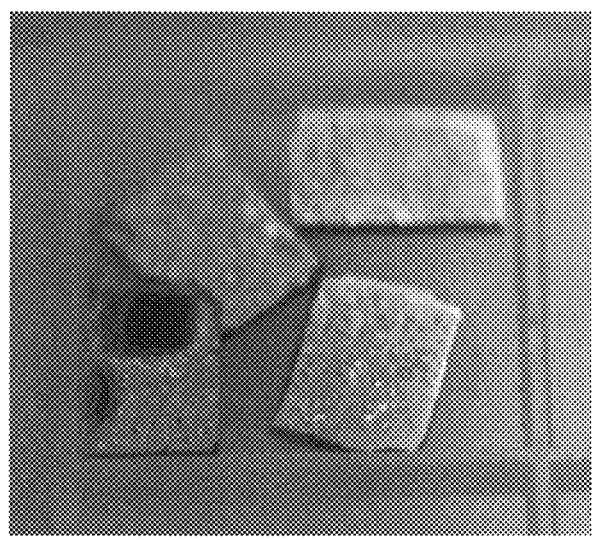
FIG. 12B is a photograph of an aluminum surface after being left in the atmosphere of the test sample illustrated in FIG. 10B.

In these test samples s1 and s2, the element concentration in the depth direction was measured with use of the above-described sputtering method and X-ray photoelectron spectroscopy (XPS). Results of the test sample s1 and results of the test samples s2 are illustrated in FIGS. 11A and 11B, respectively. It is to be noted that, in FIGS. 11A and 11B, a solid line indicates the lithium concentration, and a broken line indicates an oxygen concentration. As illustrated in FIGS. 11A and 11B, in both the test samples s1 and s2, a high concentration of lithium was detected at an outermost surface of the Al film, and the lithium concentrations in the Al film and AlLi film were equal to or less than a detection limit. However, in the test sample s1 using the QD film, the lithium concentration at the outermost surface of the Al film was 10%, and the lithium concentration near an interface between the AlLi film and the QD film was 5 to 7%. Moreover, it was found that, in the test sample s1, the oxygen concentration near the interface between the AlLi film and the QD film was high, and the oxygen concentration in the QD film tended to decrease. On the other hand, it was found that in the test sample s2 using the BCP film, the lithium concentration at the outermost surface of the Al film was 23%, and was noticeably high, compared to the above-described test sample s1. FIG. 12A is a photograph of the outermost surface of the Al film of the test sample s1, and FIG. 12B is a photograph of the outermost surface of the Al film of the test sample s2. Thus, it was found that, in the test sample s2 made of the oxygen-free organic molecule, lithium stood out in a patchy fashion more noticeably than in the test sample s1 made of the oxygen-containing organic molecule.

It is assumed from the above-described results that the lithium element tends to be drawn to the oxygen element in the atmosphere or in the film to be diffused.

Therefore, in this embodiment, the following configuration is adopted. That is, as illustrated in FIG. 1, the charge block layer 15 includes the work function adjustment layer 13 including the metal element 13a which may be, for example, lithium, and further includes the diffusion suppression layer 14A made of, for example, the oxygen-free organic molecule such as BCP between the work function adjustment layer 13 and the second electrode 16.

Figure 13:
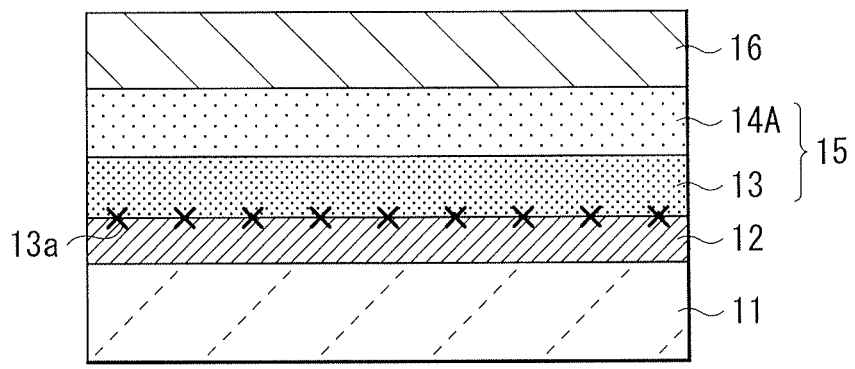
FIG. 13 is a schematic view for describing an action of the photoelectric conversion device illustrated in FIG. 1.
Figure 14:
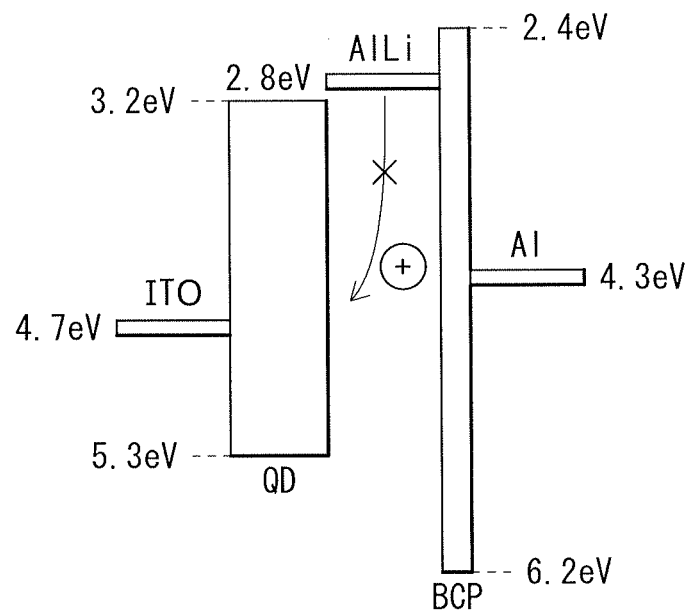
FIG. 14 is a schematic view for describing the action of the photoelectric conversion device illustrated in FIG. 1.

Thus, as illustrated in FIG. 13, the metal element 13a in the work function adjustment layer 13 is not diffused to the second electrode 16 side, and remains in the work function adjustment layer 13 or near the interface with the organic photoelectric conversion film 12. Therefore, an ideal energy band structure by the metal element 13a described in the above-described Comparative Example 2 (FIG. 5) is allowed to be formed. FIG. 14 illustrates an energy band structure in the photoelectric conversion device 10 of this embodiment. Thus, in this embodiment, in the charge block layer 15, the diffusion suppression layer 14A which may be made of, for example, the oxygen-free organic molecule is provided on the second electrode 16 side of the work function adjustment layer 13; therefore, the function (by the metal element 13a) of the work function adjustment layer 13 is allowed to be stably maintained. In addition, this diffusion suppression layer 14A is allowed to serve as a barrier in the energy band structure, thereby obtaining an effect of suppressing hole injection as well.

Therefore, in this embodiment, an effect of suppressing a dark current is allowed to be obtained.

As described above, in this embodiment, the charge block layer 15 including the work function adjustment layer 13 is included between the second electrode 16 and the organic photoelectric conversion film 12. The work function adjustment layer 13 includes the metal element 13a that adjusts the work function (the work function on the second electrode 16 side of the organic photoelectric conversion film 12). Therefore, charge movement from the second electrode 16 to the organic photoelectric conversion film 12 is suppressed to allow for efficient signal extraction. Since the diffusion suppression layer 14A is included between such a work function adjustment layer 13 and the second electrode 16, diffusion of the metal element 13a to the second electrode 16 side is allowed to be suppressed, thereby stably maintaining the function of the work function adjustment layer 13. Accordingly, device characteristics are allowed to be stabilized, and reliability is allowed to be improved.

Comparative Example 3

Figure 15:
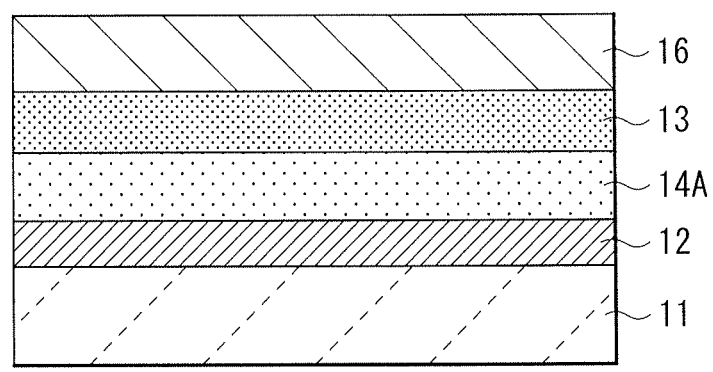
FIG. 15 is a schematic view illustrating a configuration of a photoelectric conversion device (pixel) according to Comparative Example 3.
Figure 16:
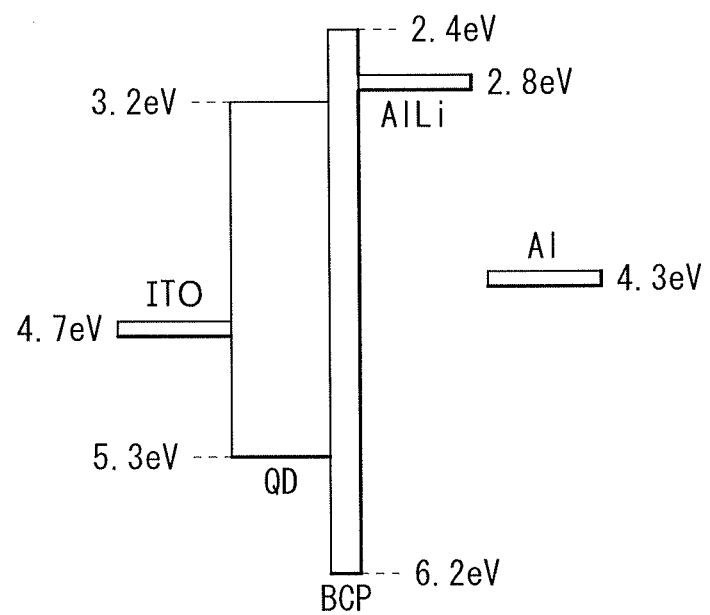
FIG. 16 is a schematic view illustrating an energy band structure of the photoelectric conversion device illustrated in FIG. 15.
Figure 17:
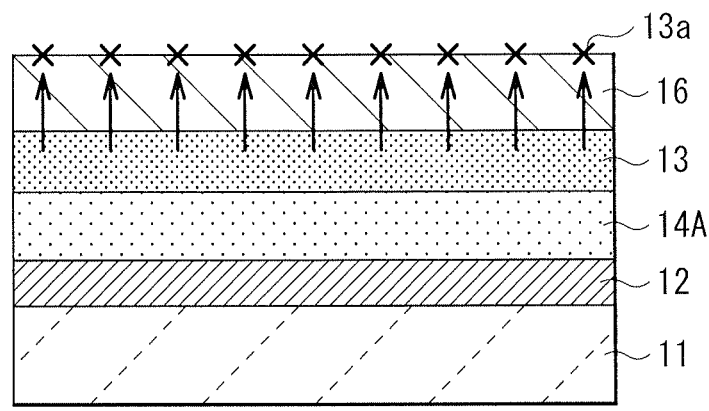
FIG. 17 is a schematic view for describing an action of the photoelectric conversion device illustrated in FIG. 15.
Figure 18:
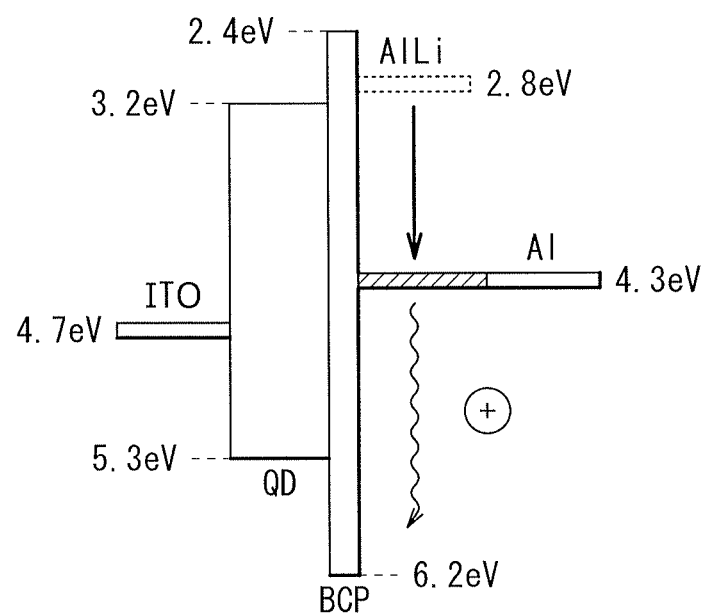
FIG. 18 is a schematic view for describing the action of the photoelectric conversion device illustrated in FIG. 15.

It is to be noted that, as illustrated in FIG. 15, in a case where the diffusion suppression layer 14A made of the oxygen-free organic molecule (BCP) is provided only on the organic photoelectric conversion film 12 (QD) side of the work function adjustment layer 13 (AlLi), it is difficult to obtain effects similar to those in the above-described embodiment. In this case, an energy band structure illustrated in FIG. 16 is ideal; however, as with the above-described Comparative Example 2, the metal element 13a (lithium) included in the work function adjustment layer 13 is actually diffused to the second electrode 16 side (FIG. 17). Therefore, as illustrated in FIG. 18, the energy band structure is substantially equal to that in a configuration in which the BCP film and the AL film are merely laminated on the organic photoelectric conversion film 12, and it is difficult to maintain the function of the work function adjustment layer 13 by the metal element 13a.

Next, modification examples (Modification Examples 1 and 2) of the charge block layer according to the above-described embodiment will be described below. It is to be noted that like components are denoted by like numerals as of the above-described embodiment and will not be further described.

Modification Example 1

Figure 19:
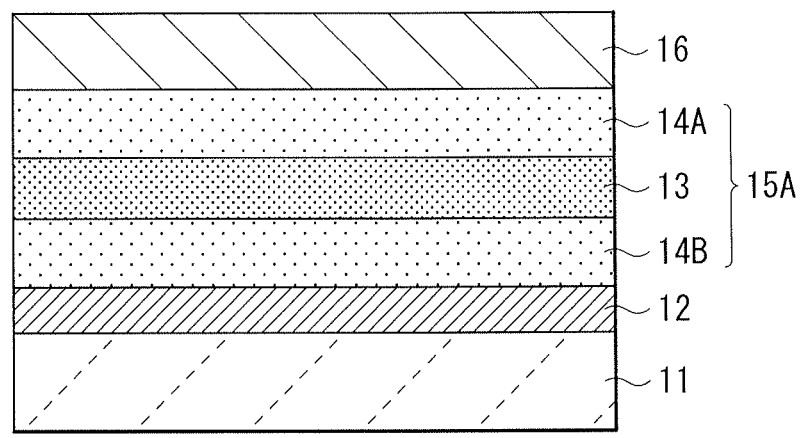
FIG. 19 is a schematic view illustrating a schematic configuration of a photoelectric conversion device (pixel) according to Modification Example 1.

FIG. 19 illustrates a configuration of a photoelectric conversion device including a charge block layer (a charge block layer 15A) according to Modification Example 1. In the above-described embodiment, the diffusion suppression layer 14A is provided only on the second electrode 16 side of the work function adjustment layer 13; however, like the charge block layer 15A of this modification example, a diffusion suppression layer 14B (a second diffusion suppression layer) may be also provided on the organic photoelectric conversion film 12 side of the work function adjustment layer 13. In other words, the charge block layer 15A may have a configuration in which the work function adjustment layer 13 is sandwiched between two diffusion suppression layers 14A and 14B. This diffusion suppression layer 14B may be configured of, for example, the above-described oxygen-free organic molecule, as with the diffusion suppression layer 14A of the above-described embodiment.

Figure 20:
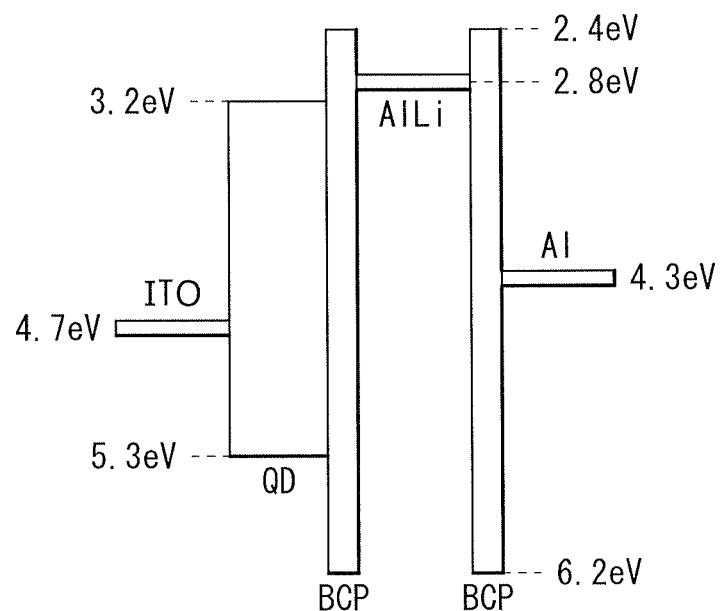
FIG. 20 is a schematic view illustrating an energy band structure of the photoelectric conversion device illustrated in FIG. 19.

In the charge block layer 15A of this modification example, the metal element 13a is sealed in the work function adjustment layer 13 by the diffusion suppression layers 14A and 14B, and as illustrated in FIG. 20, in an energy band structure, the function of the work function adjustment layer 13 (AlLi) is stably maintained. Therefore, effects similar to those in the above-described embodiment are allowed to be obtained.

Modification Example 2

Figure 21:
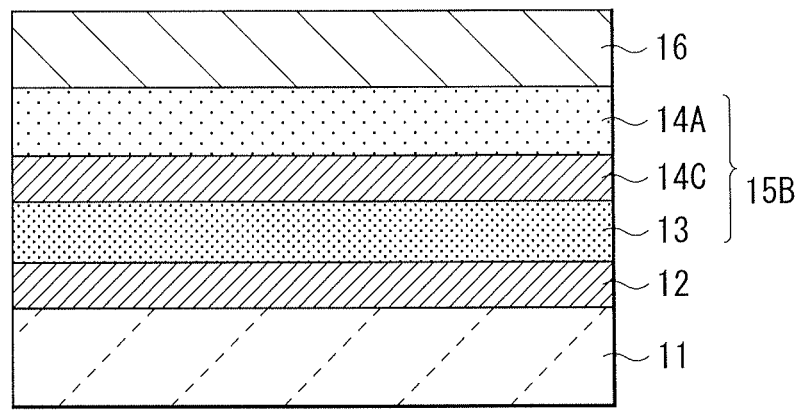
FIG. 21 is a schematic view illustrating a schematic configuration of a photoelectric conversion device (pixel) according to Modification Example 2.

FIG. 21 illustrates a configuration of a photoelectric conversion device including a charge block layer (a charge block layer 15B) according to Modification Example 2. In the above-described embodiment, only the diffusion suppression layer 14A configured of the oxygen-free organic molecule is provided on the second electrode 16 side of the work function adjustment layer 13; however, like the charge block layer 15B of this modification example, a diffusion suppression layer 14C (a third diffusion suppression layer) may be also provided between the work function adjustment layer 13 and the diffusion suppression layer 14A. In other words, the charge block layer 15A may have a configuration in which two diffusion suppression layers 14C and 14A are laminated on the work function adjustment layer 13. This diffusion suppression layer 14C may be, for example, the above-described oxygen-free organic molecule or the oxygen-containing organic molecule.

Figure 22:
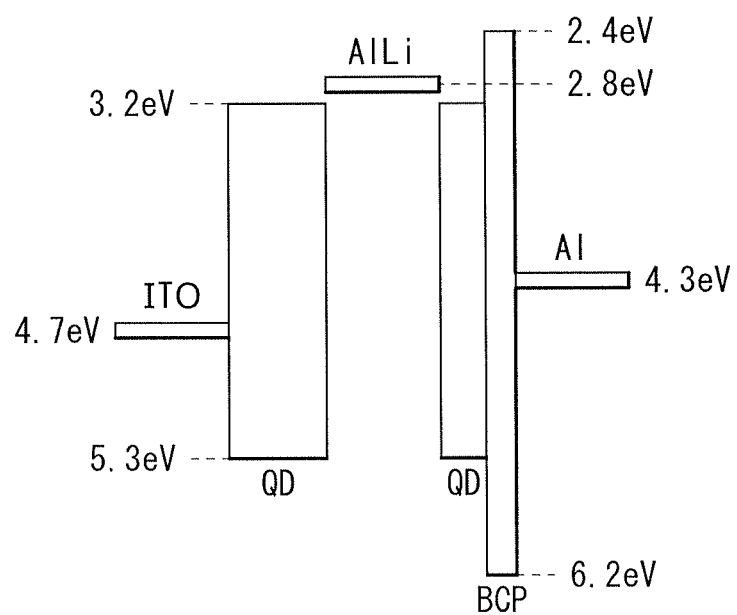
FIG. 22 is a schematic view illustrating an energy band structure of the photoelectric conversion device illustrated in FIG. 21.

In the charge block layer 15B of the modification example 2, diffusion of the metal element 13a to the second electrode 16 side is suppressed by the diffusion suppression layers 14C and 14B, and as illustrated in FIG. 22, in an energy band structure, the function of the work function adjustment layer 13 (AlLi) is stably maintained. Therefore, effects similar to those in the above-described embodiment are allowed to be obtained.

(Entire Configuration of Solid-State Image Pickup Unit)

Figure 23:
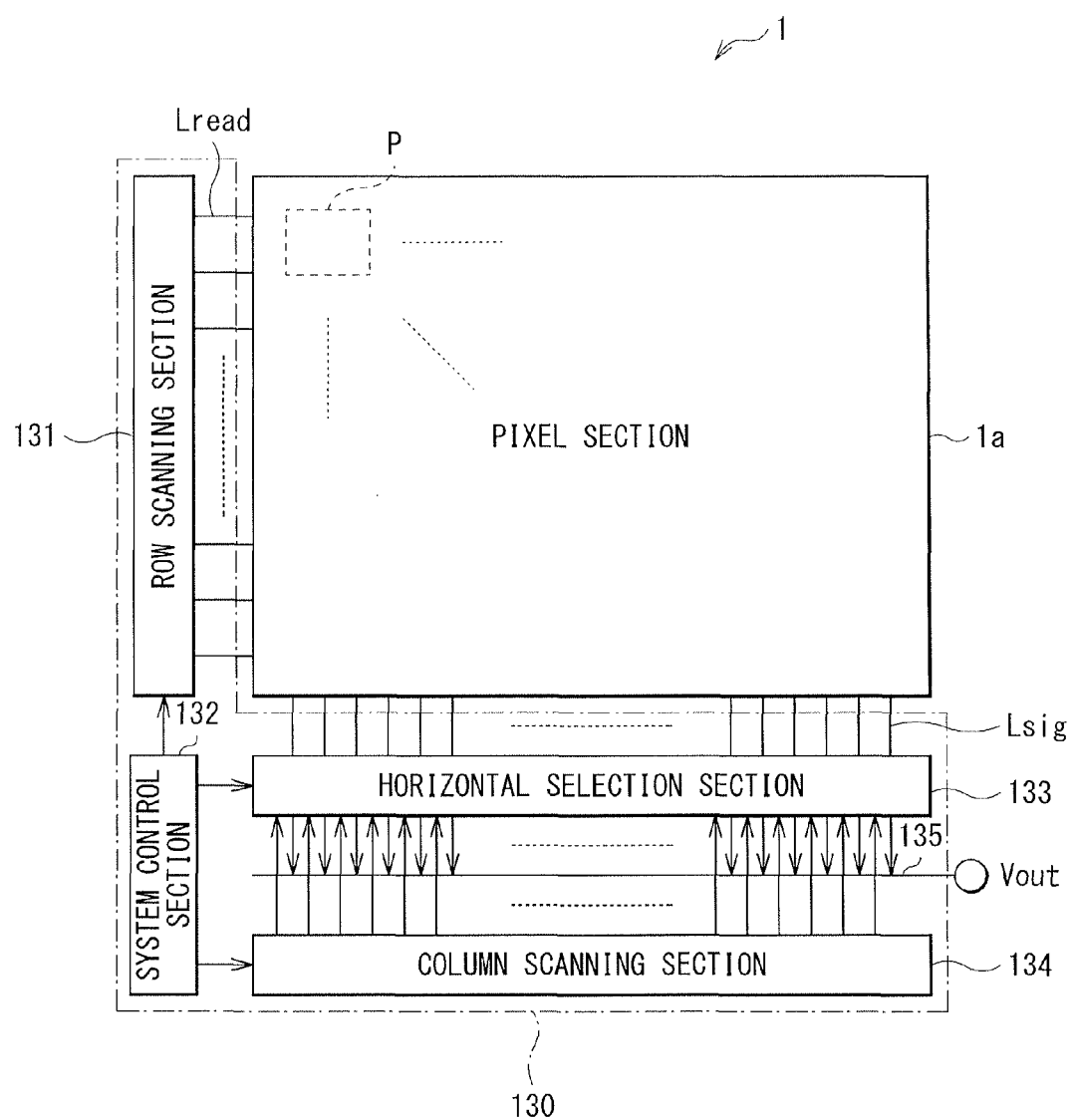
FIG. 23 is a functional block diagram of a solid-state image pickup unit.

FIG. 23 is a functional block diagram of a solid-state image pickup unit (a solid-state image pickup unit 1) using, for each pixel, the photoelectric conversion device described in the above-described embodiment. This solid-state image pickup unit 1 is a CMOS image sensor, and includes a pixel section 1A as an image pickup area and may include a circuit section 130 configured of, for example, a row scanning section 131, a horizontal selection section 133, a column scanning section 134, and a system control section 132. The circuit section 130 may be laminated with a peripheral region of the pixel section 1a or the pixel section 1a, and may be provided in the peripheral region of the pixel section 1a, or may be provided to be laminated with the pixel section 1a (in a region facing the pixel region 1a).

The pixel section 1a may include, for example, a plurality of unit pixels P (corresponding to the photoelectric conversion devices 10) that are two-dimensionally arranged in a matrix form. Pixel drive lines Lread (more specifically, row selection lines and reset control lines) may be wired to, for example, respective pixel rows of the unit pixels P, and vertical signal lines Lsig may be wired to respective pixel columns of the unit pixels P. Each of the pixel drive lines Lread is configured to transmit a drive signal for signal reading from the pixel. One ends of the respective pixel drive lines Lread are connected to respective output ends corresponding to the respective rows of the row scanning section 131.

The row scanning section 131 is configured of a shift register, an address decoder, and the like, and may be, for example, a pixel drive section that drives respective pixels P of the pixel section 1a from one row to another. Signals output from the respective pixels P in a pixel row selected and scanned by the row scanning section 131 are supplied to the horizontal selection section 133 through the respective vertical signal lines Lsig. The horizontal selection section 133 is configured of an amplifier, a horizontal selection switch, and the like provided to each of the vertical signal lines Lsig.

The column scanning section 134 is configured of a shift register, an address decoder, and the like, and sequentially drives respective horizontal selection switches of the horizontal selection section 133 while scanning the horizontal selection switches. Signals of the respective pixels transmitted through the respective vertical signal lines Lsig are sequentially transmitted to a horizontal signal line 135 by selection scanning by the column scanning section 134, and are output to the outside through the horizontal signal line 135.

The system control section 132 is configured to receive a clock, data indicating an operation mode, or the like supplied from the outside, and to output data such as internal information of the solid-state image pickup unit 1. The system control section 132 further includes a timing generator that generates various kinds of timing signals, and performs drive control on the row scanning section 131, the horizontal selection section 133, the column scanning section 134, and the like in response to the various kinds of timing signals generated by the timing generator.

Application Example

Figure 24:
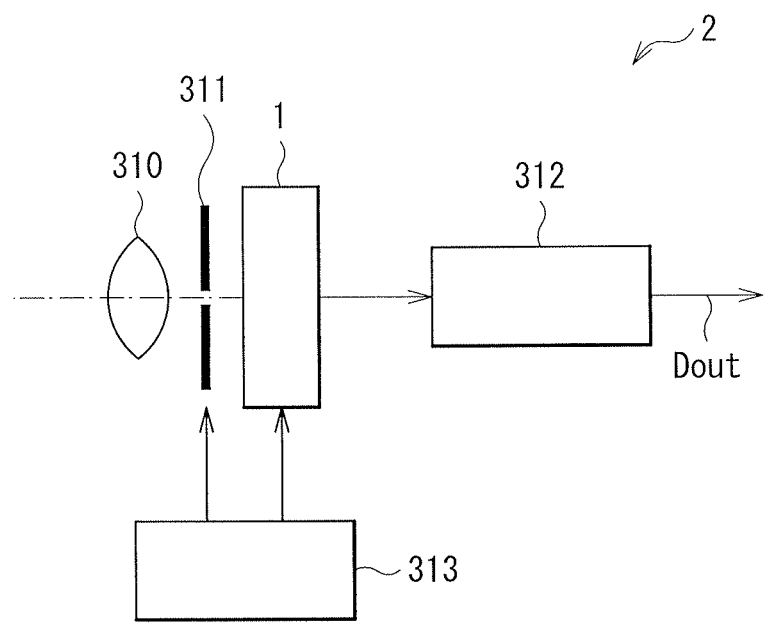
FIG. 24 is a functional block diagram of an electronic apparatus according to an application example.

The above-described solid-state image pickup unit 1 is applicable to all kinds of electronic apparatuses having an image pickup function, for example, camera systems such as digital still cameras and video cameras, and mobile phones having an image pickup function. FIG. 24 illustrates a schematic configuration of an electronic apparatus 2 (a camera) as an example thereof. The electronic apparatus 2 may be, for example, a video camera capable of taking a still image or a moving image, and includes the image pickup unit 1, an optical system (an optical lens) 310, a shutter unit 311, a drive section 313 that drives the solid-state image pickup unit 1 and the shutter unit 311, and a signal processing section 312.

The optical system 310 is configured to guide image light (incident light) from a subject to the pixel section 1a of the image pickup unit 1. This optical system 310 may be configured of a plurality of optical lenses. The shutter unit 311 is configured to control a light irradiation period and a light-shielding period for the image pickup unit 1. The drive section 313 is configured to control a transfer operation of the solid-state image pickup unit 1 and a shutter operation of the shutter unit 311. The signal processing section 312 is configured to perform various kinds of signal processing on a signal output from the solid-state image pickup unit 1. An image signal Dout that has been subjected to signal processing may be stored in a storage medium such as a memory, or may be output to a monitor or the like.

Although the present disclosure is described referring to the above-described embodiment, the modification example, and the application example, contents of the present disclosure are not limited thereto, and various modifications are possible. For example, in the above-described embodiment and the like, a case where the charge block layer of the present disclosure suppresses hole movement from the second electrode 16 to the organic photoelectric conversion film 12 is described as an example; however, the present disclosure is also applicable to a case where electron movement is suppressed, depending on the constituent materials of the organic photoelectric conversion film 12, the second electrode 16, the metal element 13a, and the like.

Moreover, it may not be necessary for the photoelectric conversion device of the present disclosure to include all components described in the above-described embodiment and the like, or on the contrary, the photoelectric conversion device of the present disclosure may include any other layer.

It is to be noted that the present disclosure is allowed to have following configurations.

(1) A photoelectric conversion device including:
an organic photoelectric conversion film;
a first electrode and a second electrode provided with the organic photoelectric conversion film in between; and
a charge block layer provided between the second electrode and the organic photoelectric conversion film,
wherein the charge block layer includes
a work function adjustment layer including a metal element on the second electrode side of the organic photoelectric conversion film, the metal element being adopted to adjust a work function, and
a first diffusion suppression layer provided between the work function adjustment layer and the second electrode and suppressing diffusion of the metal element to the second electrode side.

(2) The photoelectric conversion device according to (1), in which the first diffusion suppression layer is made of an oxygen-free organic molecule free from containing an oxygen element (O).

(3) The photoelectric conversion device according to (2), in which the oxygen-free organic molecule is one or more kinds selected from a phenanthroline derivative, a rubrene derivative, an anthracene derivative, a triazine derivative, a perylene derivative, and a tetracyanoquinodimethane (TCNQ) derivative.

(4) The photoelectric conversion device according to (2) or (3), in which the charge block layer further includes a second diffusion suppression layer on the organic photoelectric conversion film side of the work function adjustment layer, the second diffusion suppression layer being configured of an oxygen-free organic molecule free from containing an oxygen element (O).

(5) The photoelectric conversion device according to (2) or (3), in which the charge block layer further includes a third diffusion suppression layer between the work function adjustment layer and the first diffusion suppression layer, the third diffusion suppression layer being configured of an oxygen-containing organic molecule containing an oxygen element (O).

(6) The photoelectric conversion device according to any one of (1) to (5), in which the first electrode is a conductive film having light transparency.

(7) The photoelectric conversion device according to any one of (1) to (6), in which the second electrode includes one or more kinds selected from aluminum (Al), copper (Cu), nickel (Ni), chromium (Cr), vanadium (V), titanium (Ti), zirconium (Zr), niobium (Nb), molybdenum (Mo), ruthenium (Ru), palladium (Pd), hafnium (Hf), tantalum (Ta), tungsten (W), platinum (Pt), and gold (Au).

(8) The photoelectric conversion device according to any one of (1) to (6), in which the second electrode is a conductive film having light transparency and a different work function from the first electrode.

(9) The photoelectric conversion device according to any one of (1) to (8), in which the metal element is one of lithium (Li), beryllium (Be), sodium (Na), magnesium (Mg), potassium (K), calcium (Ca), rubidium (Rb), strontium (Sr), cesium (Cs), and barium (Ba).

(10) A solid-state image pickup unit provided with a plurality of pixels each of which includes a photoelectric conversion device, the photoelectric conversion device including:
an organic photoelectric conversion film;
a first electrode and a second electrode provided with the organic photoelectric conversion film in between; and
a charge block layer provided between the second electrode and the organic photoelectric conversion film,
in which the charge block layer includes
a work function adjustment layer including a metal element on the second electrode side of the organic photoelectric conversion film, the metal element being adopted to adjust a work function, and
a first diffusion suppression layer provided between the work function adjustment layer and the second electrode and suppressing diffusion of the metal element to the second electrode side.

(11) An electronic apparatus provided with a solid-state image pickup unit, the solid-state image pickup unit being provided with a plurality of pixels each of which includes a photoelectric conversion device, the photoelectric conversion device including:
an organic photoelectric conversion film;
a first electrode and a second electrode provided with the organic photoelectric conversion film in between; and
a charge block layer provided between the second electrode and the organic photoelectric conversion film,
in which the charge block layer includes
a work function adjustment layer including a metal element on the second electrode side of the organic photoelectric conversion film, the metal element being adopted to adjust a work function, and
a first diffusion suppression layer provided between the work function adjustment layer and the second electrode and suppressing diffusion of the metal element to the second electrode side.

The present disclosure contains subject matter related to that disclosed in Japanese Priority Patent Application No.

2012-244506 filed in the Japan Patent Office on Nov. 6, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion device comprising:
an organic photoelectric conversion film;
a first electrode and a second electrode provided with the organic photoelectric conversion film in between; and
a charge block layer provided between the second electrode and the organic photoelectric conversion film,
wherein the charge block layer includes
a work function adjustment layer including a metal element on a side of the organic photoelectric conversion film that is closest to the second electrode, the metal element being adopted to adjust a work function, and
a first diffusion suppression layer provided between the work function adjustment layer and the second electrode,
wherein the first diffusion suppression layer is capable of suppressing diffusion of the metal element to the side of the organic photoelectric conversion film that is closest to the second electrode,
wherein the first diffusion suppression layer is made of at least one oxygen-free organic molecule selected from a phenanthroline derivative, a rubrene derivative, an anthracene derivative, a triazine derivative, a perylene derivative, and a tetracyanoquinodimethane (TCNQ) derivative.

2. The photoelectric conversion device according to claim 1, wherein the charge block layer further includes a second diffusion suppression layer on the organic photoelectric conversion film side of the work function adjustment layer, and wherein the second diffusion suppression layer is made of at least one oxygen-free organic molecule selected from a phenanthroline derivative, a rubrene derivative, an anthracene derivative, a triazine derivative, a perylene derivative, and a tetracyanoquinodimethane (TCNQ) derivative.

3. The photoelectric conversion device according to claim 1, wherein the charge block layer further includes a third diffusion suppression layer between the work function adjustment layer and the first diffusion suppression layer, and wherein the third diffusion suppression layer is made of at least one oxygen-free organic molecule selected from a phenanthroline derivative, a rubrene derivative, an anthracene derivative, a triazine derivative, a perylene derivative, and a tetracyanoquinodimethane (TCNQ) derivative.

4. The photoelectric conversion device according to claim 1, wherein the first electrode is a conductive film having light transparency.

5. The photoelectric conversion device according to claim 4, wherein the first electrode is configured of one kind selected from indium tin oxide (ITO), tin oxide (TO), a tin oxide ($SnO_2$)-based material doped with a dopant, and a zinc oxide-based material doped with a dopant.

6. The photoelectric conversion device according to claim 1, wherein the second electrode includes one or more kinds selected from aluminum (Al), copper (Cu), nickel (Ni), chromium (Cr), vanadium (V), titanium (Ti), zirconium (Zr), niobium (Nb), molybdenum (Mo), ruthenium (Ru), palladium (Pd), hafnium (Hf), tantalum (Ta), tungsten (W), platinum (Pt), and gold (Au).

7. The photoelectric conversion device according to claim 1, wherein the second electrode is a conductive film having light transparency and a different work function from the first electrode.

8. The photoelectric conversion device according to claim 7, wherein the second electrode is configured of one kind selected from indium tin oxide (ITO), tin oxide (TO), a tin oxide ($SnO_2$)-based material doped with a dopant, and a zinc oxide-based material doped with a dopant.

9. The photoelectric conversion device according to claim 1, wherein the metal element is one of lithium (Li), beryllium (Be), sodium (Na), magnesium (Mg), potassium (K), calcium (Ca), rubidium (Rb), strontium (Sr), cesium (Cs), and barium (Ba).

10. A photoelectric conversion device comprising:
an organic photoelectric conversion film;
a first electrode and a second electrode provided with the organic photoelectric conversion film in between; and
a charge block layer provided between the second electrode and the organic photoelectric conversion film,
wherein the charge block layer includes
a work function adjustment layer including a metal element on a side of the organic photoelectric conversion film that is closest to the second electrode, the metal element being adopted to adjust a work function, and
a first diffusion suppression layer provided between the work function adjustment layer and the organic photoelectric conversion film,
wherein the first diffusion suppression layer is capable of suppressing diffusion of the metal element,
wherein the first diffusion suppression layer is made of at least one oxygen-free organic molecule selected from a phenanthroline derivative, a rubrene derivative, an anthracene derivative, a triazine derivative, a perylene derivative, and a tetracyanoquinodimethane derivative,
wherein the charge block layer further includes a second diffusion suppression layer on the side of the organic photoelectric conversion film that is closest to the second electrode, and
wherein the second diffusion suppression layer is made of at least one oxygen-free organic molecule selected from a phenanthroline derivative, a rubrene derivative, an anthracene derivative, a triazine derivative, a perylene derivative, and a tetracyanoquinodimethane derivative.

11. A solid-state image pickup unit provided with a plurality of pixels each of which includes a photoelectric conversion device, the photoelectric conversion device comprising:
an organic photoelectric conversion film;
a first electrode and a second electrode provided with the organic photoelectric conversion film in between; and
a charge block layer provided between the second electrode and the organic photoelectric conversion film,
wherein the charge block layer includes
a work function adjustment layer including a metal element on a side of the organic photoelectric conversion film that is closest to the second electrode, the metal element being adopted to adjust a work function, and
a first diffusion suppression layer provided between the work function adjustment layer and the second electrode,
wherein the first diffusion suppression layer is capable of suppressing diffusion of the metal element to the side of the organic photoelectric conversion film that is closest to the second electrode, wherein the first diffusion suppression layer is made of at least one oxygen-free organic molecule selected from a phenanthroline derivative, a rubrene derivative, an anthracene derivative, a triazine derivative, a pervlene derivative, and a tetracyanoquinodimethane derivative.

12. An electronic apparatus provided with a solid-state image pickup unit, the solid-state image pickup unit being provided with a plurality of pixels each of which includes a photoelectric conversion device, the photoelectric conversion device comprising:

an organic photoelectric conversion film;

a first electrode and a second electrode provided with the organic photoelectric conversion film in between; and a charge block layer provided between the second electrode and the organic photoelectric conversion film, wherein the charge block layer includes a work function adjustment layer including a metal element on the a side of the organic photoelectric conversion film that is closest to the second electrode, the metal element being adopted to adjust a work function, and a first diffusion suppression layer provided between the work function adjustment layer and the second electrode, wherein the first diffusion suppression layer is capable of suppressing diffusion of the metal element to the side of the organic photoelectric conversion film that is closest to the second electrode, wherein the first diffusion suppression layer is made of at least one oxygen-free organic molecule selected from a phenanthroline derivative, a rubrene derivative, an anthracene derivative, a triazine derivative, a perylene derivative, and a tetracyanoquinodimethane derivative.

* * * * *